United States Patent [19]

Reiss et al.

[11] Patent Number: 5,087,876
[45] Date of Patent: Feb. 11, 1992

[54] APPARATUS AND METHOD FOR MAKING SURFACE PHOTOVOLTAGE MEASUREMENTS OF A SEMICONDUCTOR

[75] Inventors: Leszek Reiss; Emil Kamieniecki, both of Lexington, Mass.

[73] Assignee: Semitest, Inc., Billerica, Mass.

[21] Appl. No.: 553,916

[22] Filed: Jul. 16, 1990

[51] Int. Cl.⁵ .............................................. G01R 31/26
[52] U.S. Cl. ................................. 324/158 D; 324/73.1; 324/158 R
[58] Field of Search .............. 324/73.1, 158 R, 158 D, 324/71.5; 250/310, 311, 492.2, 305, 306, 307; 356/237

[56] References Cited

U.S. PATENT DOCUMENTS

| | | | |
|---|---|---|---|
| 4,544,887 | 10/1985 | Kamieniecki | 324/158 R |
| 4,827,212 | 5/1989 | Kamieniecki | 324/158 R |
| 4,891,584 | 1/1990 | Kamieniecki et al. | 324/158 R |

Primary Examiner—Kenneth A. Wieder
Assistant Examiner—Vinh P. Nguyen
Attorney, Agent, or Firm—Kriegsman & Kriegsman

[57] ABSTRACT

An apparatus for making ac surface photovoltage (SPV) measurements of a specimen of semiconductor material under variable dc bias voltage conditions includes a light source whose output beam is intensity modulated, a reference electrode, a guard electrode, a back electrode, a first voltage for biasing the reference electrode with a variable dc voltage and a second voltage separate from the first voltage for biasing the guard electrode such that an accumulation layer is established in the area on the specimen controlled by the guard electrode to prevent flow of carriers between the area controlled by the reference electrode and the rest of the specimen.

14 Claims, 1 Drawing Sheet

APPARATUS AND METHOD FOR MAKING SURFACE PHOTOVOLTAGE MEASUREMENTS OF A SEMICONDUCTOR

BACKGROUND OF THE INVENTION

The present invention relates to an apparatus and method for making ac surface photovoltage (SPV) measurements of a specimen of semiconductor material under variable dc bias voltage conditions.

In U.S. Pat. No. 4,891,584 issued on Jan. 2, 1990, to E. Kamieniecki, etc. there is disclosed an apparatus and method for making ac surface photovoltage measurements of a specimen of semiconductor material under variable d.c. bias voltage conditions. The apparatus includes a reference electrode, a guard electrode, a back electrode, a light source whose output is intensity modulated, a variable dc voltage source and processing electronics.

The reference electrode is used to pick up the ac photovoltage signals. The guard electrode is used for limiting fringing field problems in the application of the bias field and for defining more clearly the area of the specimen from which the SPV signals are received by shunting to ground any signals generated from the specimen outside the area underneath the reference electrode. The back electrode is used to support the specimen and is kept at ground potential. The variable dc voltage source is used to bias the reference electrode and also the guard electrode. The processing electronics is used to process the signals picked up by the reference electrode.

In use, the reference electrode is electrically separated from the specimen so as to provide a capacitance type of pickup. The modulated light beam from the light source is focussed through the reference electrode the spot on the semiconductor surface and its location on the semiconductor surface adjusted by a scanning mechanism. As the bias voltage is varied over a wide range (i.e. from about 0 volts up to about 500 volts), the ac surface photovoltage signals which are stimulated by the intensity modulated beam of light are picked up between the back electrode and the reference electrode and fed into the electronics part of the apparatus for processing.

It has been found that when making surface photovoltage measurements using the apparatus as described in the above noted U.S. Pat. No. 4,891,584 there may, in certain test situations, be a flow or exchange of carriers on the semiconductor surface between the area directly under the reference electrode (i.e. the area under test) and the remainder of the surface of the specimen. This flow of carriers can adversely effect the accuracy of the tests being conducted. Similar effects have been observed in the C-V technique described by E. H. Nicollan and J. R. Brews in MOS (Metal Oxide Semiconductor) Physics and Technology, Wiley, N.Y., 1982, p. 150-153.

Accordingly, it is an object of this invention to provide a new and improved apparatus for making ac surface photovoltage measurements of a specimen of semiconductor material under variable dc bias voltage conditions;

It is another object of this invention to provide a new and improved method for making ac surface photovoltage measurements of a specimen of semiconductor material under variable dc bias voltage conditions.

It is still a further object of this invention to provide an apparatus and method as described above wherein the exchange or flow of carriers at the surface between the area of the semiconductor under test and the remainder of the semiconductor during the testing procedure is essentially eliminated.

SUMMARY OF THE INVENTION

According to this invention the flow of carriers between the area under the reference electrode and the remainder of the specimen is eliminated by biasing the reference electrode and the guard independently from one another and in a manner such that the guard electrode forces accumulation conditions in the area of the semiconductor surface under its control and which surrounds the area controlled by the reference electrode. By surrounding the area controlled by the reference electrode with an area kept in accumulation conditions, a lateral field-induced junction is created which contains photo-induced minority carriers at the surface of the semiconductor under the reference electode. The barrier thus created serves to separate (i.e. electrically isolate) the area of the specimen underneath the reference electrode from the remainder of the specimen.

Various features and advantages of the invention will appear from the description to follow. In the description, reference is made to the accompanying drawing which forms a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF PREFERRED EMBODIMENTS

The present invention is directed to a method and apparatus for making ac surface photovoltage measurements of a specimen of semiconductor material under variable dc bias voltage conditions which includes an intensity modulated light source, a reference electrode and a guard wherein the area of the semiconductor controlled by the reference electrode is completely surrounded by an area controlled by the guard electrode.

Figure 1:
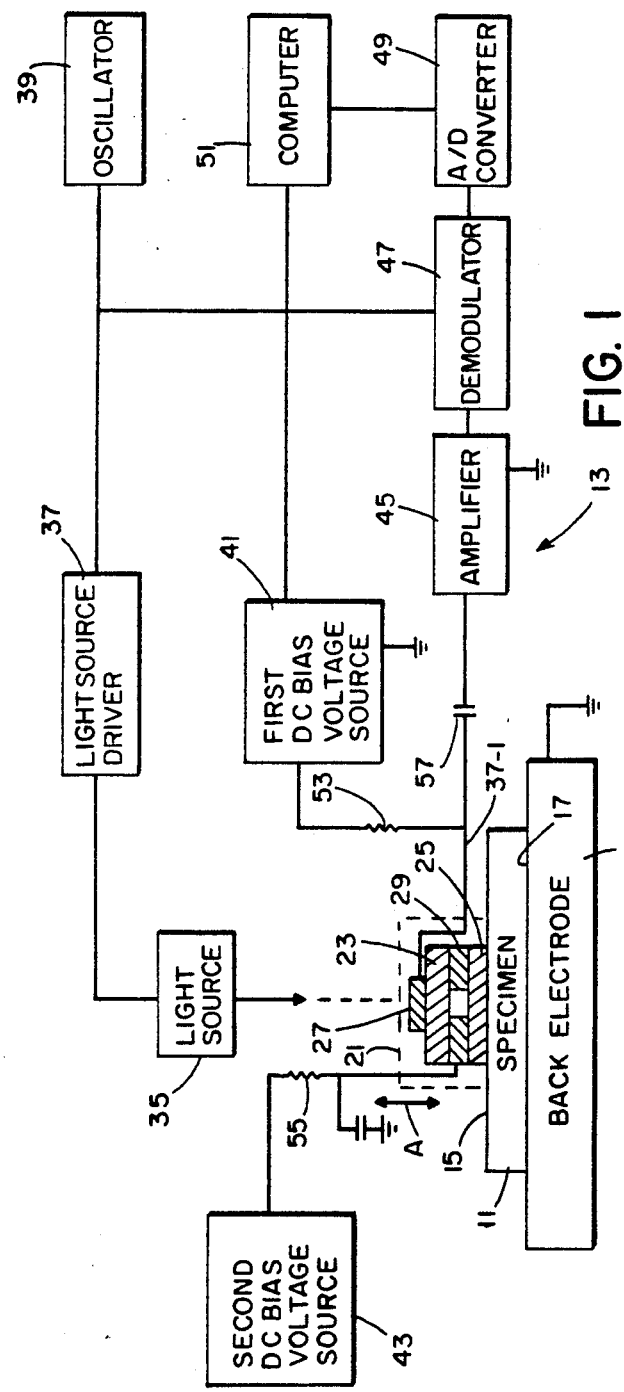
FIG. 1 is a schematic of an apparatus for making ac surface photovoltage measurements of a specimen of semiconductor material under variable dc bias voltage conditions according to this invention.

Referring now to the drawings, there is shown in FIG. 1 a simplified schematic illustration of an apparatus for making ac surface photovoltage measurements of a specimen of semiconductor material under variable dc bias voltage condition according to this invention.

Portions of the apparatus not pertinent to this invention are not shown. In the illustration, the specimen of semiconductor material is identified by reference numeral 11 and the apparatus is identified by reference numeral 13.

Specimen 11 has two major surfaces 15 and 17, respectively, surface 15 being the surface under testing. Specimen 11 may comprise a slab of silicon in a wafer configuration. An oxide coating (not shown) may be on surface 15.

Apparatus 13 includes a back electrode 19 and a capacitive pickup type probe assembly 21. Back electrode 19, which also serves as a base or support for specimen 11, is a rigid member made of a conductive metal, such as aluminum. As can be seen, specimen 11 is seated on back electrode 19 with surface 15 facing upward (at the top in FIG. 1) and surface 17 in contact with back electrode 19 (at the bottom in FIG. 1). Back electrode 19 is connected to ground. Back electrode 19 is stationary while probe assembly 21 is movable vertically relative to back electrode 19, as shown by arrows A, so that it can be lowered into contact with specimen 11 for testing and then raised after the measurements have been taken. Alternatively, (not shown) probe assembly 21 could be stationary and back electrode 19 movable vertically relative to reference electrode assembly 21.

Figure 2:
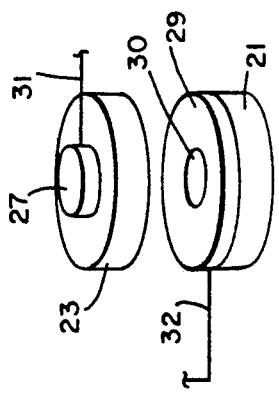
FIG. 2 is a perspective view of the probe assembly shown in FIG. 1.

Probe assembly 21 which is also shown in perspective view in FIG. 2 includes upper and lower sheets of mylar labelled 23 and 25 respectively. A pair of coatings 27 and 29 of conductive material are formed on the top surfaces of the sheets 23 and 25 respectively by any suitable means, such as deposition. Coating 27 is circular in shape and serves as a reference electrode. Coating 29 is annularly shaped and serves as a guard electrode. Both coatings 27 and 29 may be made of aluminum. The thickness of coating 27 is such that it is transparent. Reference electrode 27 is smaller than specimen 11. Coating 29 is preferably, nontransparent; however it is not essential that it be nontransparent. As can be seen, sheet 25 electrically separates coatings 27 and 29 from specimen 11 and sheet 23 electrically separates coating 27 from coating 29. The center opening 30 in coating 29 is smaller than the area of coating 27. A conductor 31 is connected to electrode 27 and a conductor 33 is connected to electrode 29.

Instead of having coating 29 on the top surface of sheet 25, coating 29 could, if desired, be formed on the bottom surface of sheet 23.

Apparatus 13 further includes a light source 35, a light source driver 37, an oscillator 39, a reference electrode bias voltage source 41, a guard electrode bias voltage source 43, an amplifier 45, a demodulator 47, an analog to digital A/D converter 49 and a computer 51.

Light source 35 is fixed in the x-y (i.e. horizontal) direction relative to probe assembly 21 and positioned so that the light beam is vertically aligned with reference electrode 27.

Light source 35 is separate from reference electrode assembly 21, but may if desired be attached to reference electrode assembly 21 by a frame (not shown).

Reference electrode bias voltage source 41 produces a variable dc voltage. Guard electrode bias voltage source 43 produces a voltage sufficient to place an area of the surface specimen surrounding an area controlled by the reference electrode in an accumulation condition at least during the time when the area of the specimen controlled the reference electrode is in an inversion condition. Source 43 may be either a fixed dc voltage or a variable dc voltage. If voltage source 43 is one that produces a variable dc voltage, the voltage must be such that the area on the semiconductor controlled by guard electrode is in accumulation at least during the time when the area on the semiconductor controlled by the reference electrode is between the onset of accumulation and the onset of strong inversion. If voltage source 43 is fixed it is sized so as to continually create an accumulation layer.

In using apparatus 13, specimen 11 is placed on back electrode 19 as shown. Probe assembly 21 is then moved vertically down so that reference electrode 27 is in close proximity to specimen 11. Probe assembly 21 is then pressed down against specimen 11 by any means (not shown) with sufficient pressure so that reference electrode 27 is in close compliance (i.e. parallel relationship) with surface 15 of specimen 11. Since reference electrode 27 is formed on the top surface of insulator 35 it does not actually come into contact with specimen but rather forms a capacitance type of pickup. A beam of light from source 35 is then directed through flexible reference electrode assembly 21 onto front surface 15 of specimen 11 to generate the SPV signals. As can be appreciated, the light beam from source 35 will pass through reference electrode 27 since it is transparent. Source 35, which may be a light emitting diode, is driven by light source driver 37 which modulates the light beam that is emitted. Light source driver 37 is driven by oscillator 39.

At the same time the bias voltages from sources 41 and 43 are applied to their respective electrodes 27 and 29 through separation resistors 53 and 55, respectively.

The ac photovoltage signals developed across the surface 15 of specimen 11 upon illumination as the bias voltage from source 41 is varied are capacitively picked up by reference electrode 27 and fed through an isolation capacitor 57 into amplifier 45. Signals picked up by guard electrode 29 are shunted to ground. As can be appreciated, guard electrode 29 also serves to avoid fringing field problems in the application of the bias field by the reference electrode and also serves to limit the area on surface 15 of specimen 11 that provides the SPV signal to reference electrode 27. The output of amplifier 45 is fed into demodulator 47. The output of demodulator 47 is fed into A/D converter 49 whose output is fed into computer 51.

Variable dc bias voltage source 41 may be, for example, in the form of a voltage ramp generator or an amplifier with the ramp supplied by computer 51.

If desired, an insulator of appropriate material and thickness (not shown) may be placed between specimen 11 and back electrode 19 for protective purposes.

Figure 3:
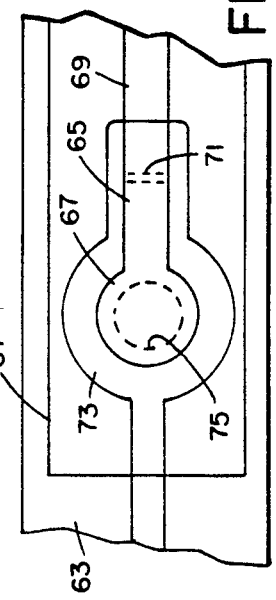
FIGS. 3 and 4 are top and front views, respectively, of a modification of the probe assembly shown in FIG. 1.
Figure 4:
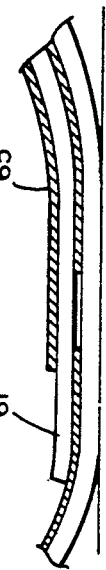

Referring now to FIGS. 3 and 4 there are shown top and front views, respectively, of a modification 59 of probe assembly 21. As can be seen, modification 59 includes sheets 61 and 63 made of Mylar or other transparent insulative material.

Sheet 61, which is the upper sheet, has a transparent conductive coating 65 covering a portion of its top surface. Coating 65 is shaped to define a small circular area 67 at the center of the sheet which serves a reference electrode and a narrow strip 69 which serves as a contact. Strip 69 is bent up beyond zone 71. Lower sheet 63 has a nontransparent conductive coating 73 which covers a portion of its top surface. Coating 73 has a small circular opening 75 at the center which is slightly smaller in size than area 69. Sheets 61 and 63 are stacked so that area 69 is in registration with area 75. Conductive coating 73 on sheet 63 serves as a guard electrode. Coatings 65 and 73 may both be aluminum. Coating 65 is of appropriate thickness so as to be transparent. Guard 73 has an extension portion 77 which projects out beyond a zone 71 so that signals generated outside the area controlled by the guard electrode are not picked up by the reference electrode. Reference electrode 67 is much smaller in size than specimen 11.

The embodiments of the present invention described above are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. Apparatus for use in making ac surface photovoltage measurements of a specimen of semiconductor material under variable dc bias voltage conditions, said specimen having first and second major surfaces, said apparatus comprising:
   a. means for illuminating at least a portion of said first major surface of said specimen with a beam of intensity modulated light,
   b. a back electrode adapted to receive said second major surface of said specimen,
   c. a probe assembly positionable in the path of said light beam in close proximity to said first major surface of said specimen, said probe assembly comprising:
      i. a reference electrode, and
      ii. a guard electrode,
   d. first dc voltage means for applying a variable dc bias voltage between said back electrode and said reference electrode, and
   e. second voltage means independent of said first voltage means for applying a bias voltage between said back electrode and said guard electrodes.
   f. the ac surface photovoltage signals generated by said light beam appearing between said reference electrode and said back electrode.

2. The apparatus of claim 1 wherein said specimen comprises two areas and wherein one area of the specimen is controlled by said reference electrode and another area of said specimen is controlled by said guard electrode and wherein the area of the specimen controlled by the reference electrode is completely surrounded by the area of the specimen controlled by the guard electrode.

3. The apparatus of claim 2 and wherein the second voltage means is such so as to produce an accumulation layer at the surface of the specimen which surrounds the area controlled by the reference electrode.

4. The apparatus of claim 3 and wherein the second voltage means is a fixed dc voltage.

5. The apparatus of claim 3 and wherein the second voltage means is a variable dc voltage.

6. The apparatus of claim 1 and wherein the back electrode is below the specimen and the reference electrode and guard electrode are above the specimen.

7. The apparatus of claim 1 and wherein the reference electrode is circularly shaped and the guard electrode is annularly shaped.

8. The apparatus of claim 7 and wherein the reference electrode and the guard electrode are both aluminum coatings.

9. The apparatus of claim 1 and wherein the guard electrode is above the specimen and wherein the area on the specimen controlled by the guard electrode is the area on the specimen directly below the guard electrode.

10. The apparatus of claim 1 and wherein the reference electrode is made of a material that is transparent to the light produced by the illuminating means.

11. The apparatus of claim 1 and wherein the bias voltage produced by the second voltage means is a dc voltage.

12. The apparatus of claim 11 and wherein the dc voltage produced by the second dc voltage means is a fixed dc voltage.

13. The apparatus of claim 11 and wherein the dc voltage produced by the second dc voltage means is a variable dc voltage.

14. A method for making ac surface photovoltage measurements of a specimen of semiconductor material under variable dc bias voltage conditions, said specimen having first and second major surfaces, said method comprising:
   a. applying a variable dc voltage to a reference electrode positioned spaced from specimen, said reference electrode controlling an area on said specimen,
   b. illuminating at least a portion of said area on said specimen which is controlled by said reference electrode with a beam of intensity modulated light,
   c. establishing an accumulation layer on the specimen around the area which is controlled by the reference electrode, and
   d. measuring the surface photovoltage signal appearing between said reference electrode and a back electrode.

* * * * *